United States Patent
Shibata (10) Patent No.: US 12,456,683 B2
(45) Date of Patent: Oct. 28, 2025

(54) LAYOUT OF CONDUCTIVE VIAS FOR SEMICONDUCTOR DEVICE

(71) Applicant: MICRON TECHNOLOGY, INC., Boise, ID (US)

(72) Inventor: Kayoko Shibata, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 483 days.

(21) Appl. No.: 17/665,367

(22) Filed: Feb. 4, 2022

(65) Prior Publication Data

US 2023/0253323 A1     Aug. 10, 2023

(51) Int. Cl.
| | |
|---|---|
| *H01L 23/528* | (2006.01) |
| *H01L 23/48* | (2006.01) |
| *H01L 23/498* | (2006.01) |
| *H01L 23/50* | (2006.01) |
| *H01L 23/522* | (2006.01) |
| *H01L 23/538* | (2006.01) |
| *H01L 25/065* | (2023.01) |
| *H01L 25/18* | (2023.01) |
| *H10D 89/10* | (2025.01) |

(52) U.S. Cl.
CPC ........ *H01L 23/5286* (2013.01); *H01L 23/481* (2013.01); *H01L 25/0652* (2013.01); *H01L 2225/06513* (2013.01); *H01L 2225/06544* (2013.01)

(58) Field of Classification Search
CPC ............... H01L 23/5286; H01L 23/481; H01L 25/0652; H01L 2225/06513; H01L 2225/06544; H01L 23/528; H01L 23/49816; H01L 23/5383; H01L 23/5385; H01L 2225/06517; H01L 2225/06527; H01L 25/18; H01L 23/5226; H01L 23/50; H01L 27/0207
See application file for complete search history.

(56) References Cited

U.S. PATENT DOCUMENTS

| | | | | |
|---|---|---|---|---|
| 2013/0082404 A1* | 4/2013 | Kajigaya | ............... | G11C 7/1006 257/777 |
| 2020/0043530 A1* | 2/2020 | Shibata | ............... | H01L 25/0657 |

\* cited by examiner

*Primary Examiner* — Herve-Louis Y Assouman
(74) *Attorney, Agent, or Firm* — Dorsey & Whitney LLP (57) ABSTRACT

Apparatuses of overlay measurement are disclosed. An example apparatus includes: a memory array region; a peripheral region adjacent to the memory array region; a plurality of power vias in the peripheral region that provide one or more power supply voltages; and one or more wirings in the peripheral region. The one or more wirings are disposed adjacent to the memory array region. One or more power vias of the plurality of power vias are disposed through a wiring of the one or more wirings.

24 Claims, 8 Drawing Sheets

LAYOUT OF CONDUCTIVE VIAS FOR SEMICONDUCTOR DEVICE

BACKGROUND

High data reliability, high speed of memory access, lower power consumption and reduced chip size are features that are demanded from semiconductor memory. In recent years, three-dimensional (3D) memory devices by stacking dies vertically stacked and interconnecting the dies using conductive vias, such as through-substrate vias (TSVs), have been utilized. Benefits of the 3D memory devices include core chips stacked with a large number of vertical vias between the core chips and an interface chip and the memory controller, which allow wide bandwidth buses with high transfer rates between functional blocks in the core chips and the interface chip, and a considerably smaller footprint. Thus, the 3D memory devices contribute to large memory capacity, higher memory access speed and chip size reduction. Example 3D memory devices include Hybrid Memory Cube (HMC) and High Bandwidth Memory (HBM).

A large number of vertical vias may be used to transfer a clock signal, memory cell data and command sequences for controlling the core chips in a manner that the core chips can be operated independently and simultaneously at high transfer rates. Here, input/output channels on the core chips are not necessarily synchronous to each other. To accommodate such operation, the 3D memory device may include a large number of circuits that may operate simultaneously, which causes simultaneous power consumption throughout the device. In particular, the 3D memory device may include memory core chips that operate similar operations throughout circuits on each memory core chip simultaneously at high transfer rates while also having the interface chip in the 3D memory device transfer data at high rates simultaneously. Simultaneous power consumption throughout the 3D memory device may cause noise on power supply lines in and around a memory array region and signal input/output circuits in a peripheral region. The noise in and around the memory array region may interfere with operations of the signal input/output circuits, and the noise in the signal input/output circuits in the peripheral region may interfere operation in the memory cell array region. The interference caused by the noise during operations of core chips have become obstacles for higher data transmission. It may be desirable to protect signal lines of the memory array region and the peripheral region from the inference of the noise on the power lines of the peripheral region and the memory array region, respectively.

DETAILED DESCRIPTION

Various embodiments of the present disclosure will be explained below in detail with reference to the accompanying drawings. The following detailed description refers to the accompanying drawings that show, by way of illustration, specific aspects and embodiments in which the present disclosure may be practiced. These embodiments are described in sufficient detail to enable those skilled in the art to practice the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

A semiconductor device, such as a core chip, may include a memory array region, a peripheral region adjacent to the memory array region, and a plurality of power vias adjacent to the memory array region disposed in the peripheral region. The plurality of power vias may reduce noise propagation between the memory array region and the peripheral region. In some embodiments, the semiconductor device may further include groups of power vias and a group of signal vias between groups of power vias. The groups of power vias may provide power supply voltages from an interface chip to circuits around the signal vias. The groups of power vias may provide stable power supply voltages to the circuits while preventing noise propagation from the memory array region and signal vias outside the groups of power vias.

Figure 1:
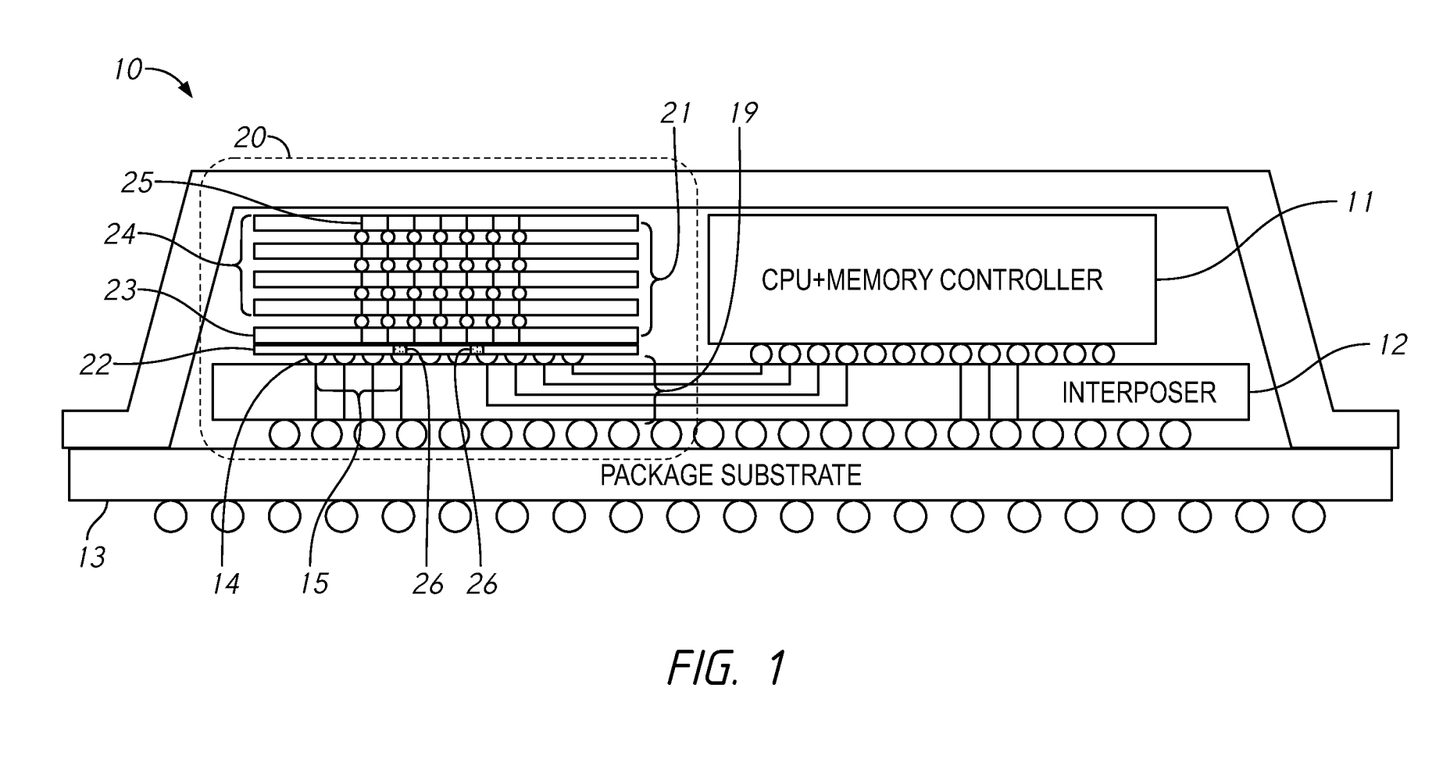
FIG. 1 is a schematic diagram of a semiconductor system including a semiconductor device that includes an interface chip and core chips, in accordance with an embodiment of the present disclosure.

FIG. 1 is a schematic diagram of a semiconductor system 10 including a semiconductor device 20 that includes an interface chip 23 and core chips 24, in accordance with an embodiment of the present disclosure. In some embodiments, the semiconductor system 10 may include a semiconductor device 20, which is a three-dimensional (3D) memory device, and a central processing unit (CPU) and memory controller 11, which may be a controller chip, on an interposer 12 on a package substrate 13. The interposer 12 may include one or more power lines 15 which supply power supply voltage from the package substrate 13. The interposer 12 includes channels 19 that may interconnect the CPU and memory controller 11 and the semiconductor device 20. For example, the semiconductor device 20 may be an HBM, an HMC, a Wide-IO DRAM, etc. The semiconductor device 20 may include chips 21 including an interface (I/F) chip 23 and core chips 24 stacked with each other. In this example, each core chip 24 may be a memory chip. Each memory chip may include memory cells and circuitries accessing the memory cells. For example, the memory cells may be DRAM memory cells. The semiconductor device 20 may include vias 25 (e.g., through substrate vias TSVs) which couple the I/F chip 23 and the core chips 24 by penetrating the I/F chip 23 and the core chips 24. The I/F chip 23 may be coupled to the interposer 12 via interconnects, such as bumps 14 and a substrate 22 on the bumps 14. The I/F chip 23 may be disposed on the substrate 22. In some embodiments, the bumps 14 may be microbumps having bump pitches of less than about or less than one hundred micro meters and exposed on an outside of the I/F chip 23. A portion of the bumps 14 may be coupled to the one or more power lines 15. Another portion of the bumps 14 may be coupled to the channels 19. Another portion of the bumps 14 may be external terminals (e.g., one or more pads) which may receive external signals and provide the external signals to internal signal wirings 26 of the substrate 22.

Figure 2:
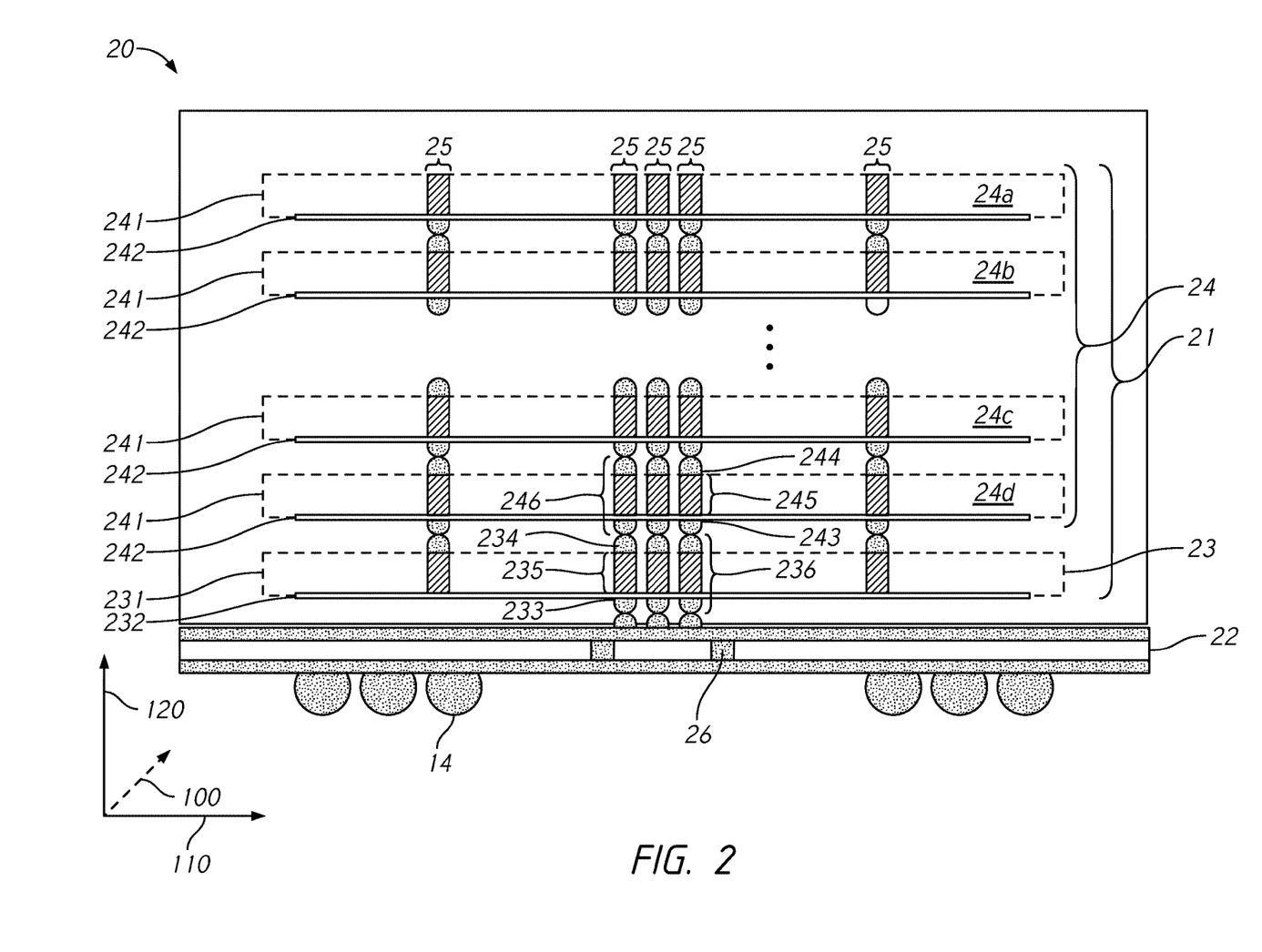
FIG. 2 is a schematic diagram of a semiconductor device including an interface chip and core chips in accordance with an embodiment of the present disclosure.

FIG. 2 is a schematic diagram of a semiconductor device 20 including an interface chip 23 and core chips 24 in accordance with an embodiment of the present disclosure. FIG. 2 is a cross-sectional diagram of the semiconductor device 20. In some embodiments, the semiconductor device 20 may include a substrate 22 and chips 21 on the substrate 22. As shown in FIG. 2, the chips 21 may include an interface (I/F) chip 23 and core chips 24 stacked on the I/F chip 23. The I/F chip 23 may be stacked on the substrate 22. The core chips 24 may include core chips 24a-24d. The core chip 24d may be stacked on the I/F chip 23. The core chip 24c may be stacked on the core chip 24d. The core chip 24b may be stacked on the core chip 24c. The core chip 24a may be stacked on the core chip 24b. The semiconductor device 20 may include bumps 14 (e.g., one or more pads) as previously described with reference to FIG. 1.

In some embodiments, each of the I/F chip 23 and the core chips 24 may extend on a plane defined by a direction 100 and a direction 110 that is perpendicular to the direction 100. The I/F chip 23 and the core chips 24 may be stacked in a direction 120 that is perpendicular to the directions 100 and 110. The I/F chip 23 may include a wiring layer 232 on a side of the substrate 22 and a substrate layer 231 on the wiring layer 232. In some embodiments, the substrate layer 231 may include silicon. The I/F chip 23 includes through wirings 236. In some embodiments, each of the through wirings 236 includes a through electrode (TSV) 235 through the substrate layer 231. In some embodiments, each of the through wirings 236 includes a substrate terminal 233 on the wiring layer 232 which couples the substrate 22 to the TSV 235. The I/F chip 23 may include an external input/output circuit (not shown) that is coupled to substrate terminals 233. The external input/output circuit transmits signals from/to the outside of the semiconductor device 20 through the substrate 22. In some embodiments, each of the through wirings 236 includes an interface (IF) terminal 234 (e.g., surface bump) on a side of the core chips 24 which couples the TSV 235 to a corresponding interface (IF) terminal 243 of one of the core chips 24 facing the I/F chip 23. The I/F chip 23 may also include an internal signal input/output circuit (not shown) that is coupled to IF terminals 234. The internal signal input/output circuit transmits data to/from the core chips 24.

Each of the core chips 24 may include a wiring layer 242 on a side of the I/F chip 23 and a substrate layer 241 on the wiring layer 242. In some embodiments, the substrate layer 241 may include silicon. Each of the core chips 24 includes a large number of memory cells (not shown, e.g., dynamic random access memory). Each of the core chips 24 may include memory cell peripheral circuits (not shown, e.g., sense amplifiers and address decoders), timing control circuits for adjusting operation timings of the memory cell peripheral circuits, input/output circuits test circuits for defect detection in a wafer test for core chips. Each of the core chips 24 may include through wirings 246. Each of the through wirings 246 may include one or more interface (IF) terminals 243 coupled to a through wiring of another chip (either the through wiring 236 or the through wiring 246) immediately under each chip. Each of the through wirings 246 may include through electrodes 245. In some embodiments, each of the through wirings 246 may include in the core chips 24b-24d may also include one or more (IF) terminal 244 coupled to a through wiring of 246 another chip immediately above each chip.

A power supply (e.g., a positive supply voltage $V_{DD}$, a negative supply voltage $V_{SS}$) for operations of the core chips 24 is supplied by the I/F chip 23 from an external terminal 14 coupled to a power supply source (not shown), and further supplied to the core chips 24 through power supply through electrodes 235 and 245.

Figure 3A:
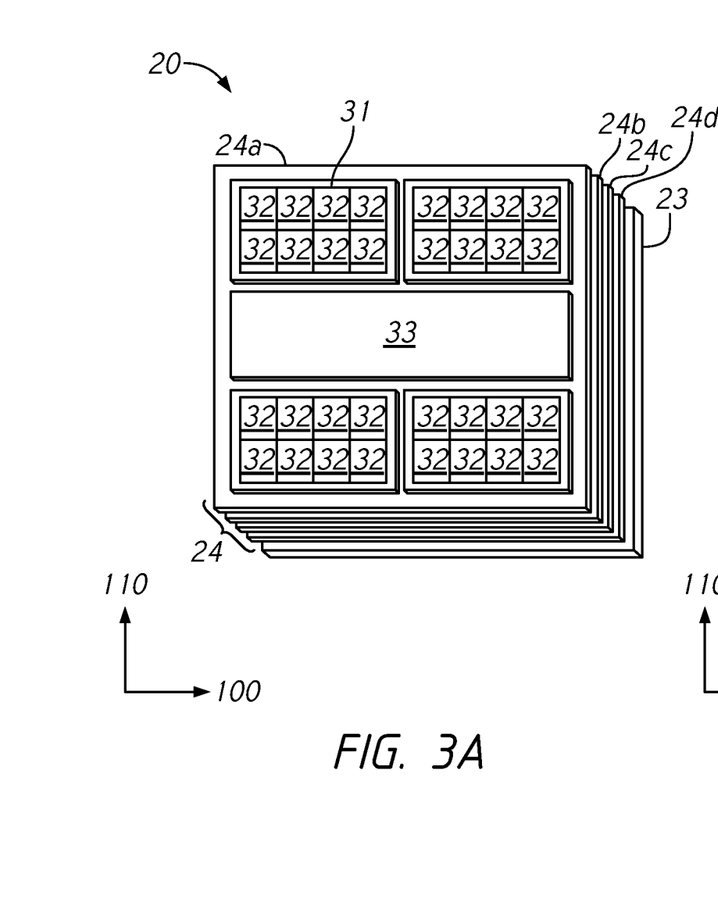
FIG. 3A is a schematic diagram of a semiconductor device including an interface chip and core chips, in accordance with an embodiment of the present disclosure.

FIG. 3A is a schematic diagram of a semiconductor device 20 including an interface chip 23 and core chips 24, in accordance with an embodiment of the present disclosure. FIG. 3A is a top view of the semiconductor device 20. In some embodiments, the semiconductor device 20 may be the semiconductor device 20 in FIG. 2. Layout configuration of the core chip 24a will be described in detail. The core chips 24b-24d may have similar layout configuration as the layout configuration of the core chip 24a.

The core chip 24a may include memory arrays 31 and a peripheral region 33 outside the memory arrays 31. In some embodiments, the memory arrays 31 may be located either on a side in the direction 110, on a side in a direction opposite to the direction 110 of a peripheral region 33 or on the both sides. The portion of the memory arrays 31 in either side may be arranged in the direction 100. In some embodiments, the peripheral region 33 may be a central area of the core chip 24a, as shown in FIG. 3A. The core chip 24a includes a large number of memory cells (not shown, e.g., dynamic random access memory). In some embodiments, each memory array 31 of the memory arrays 31 may include memory banks 32. The large number of memory cells may be disposed in separate memory banks 32.

Figure 3B:
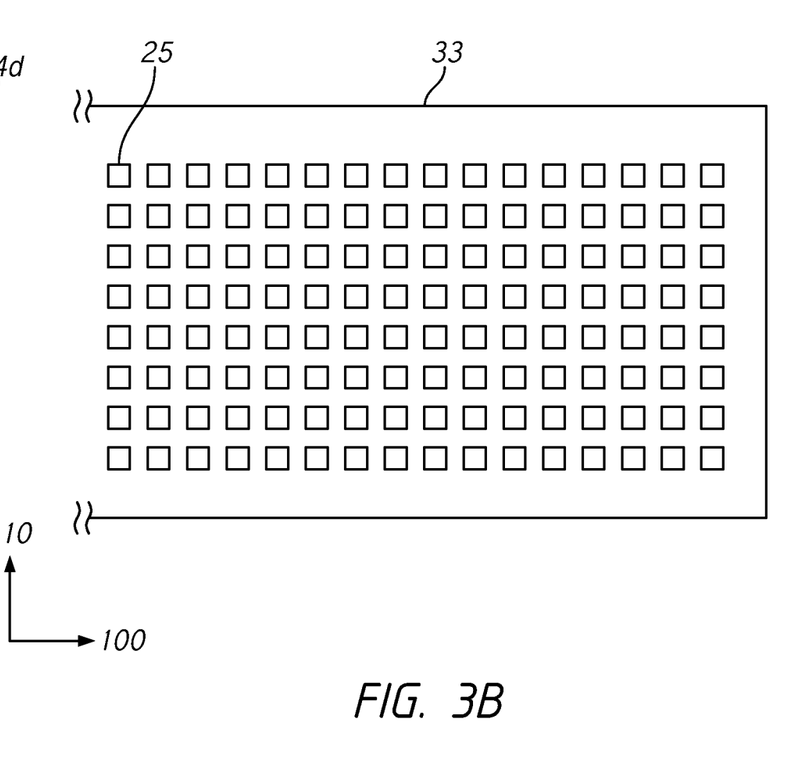
FIG. 3B is a layout diagram of through electrodes in a peripheral region of a core chip of the memory device, in accordance with an embodiment of the present disclosure.

FIG. 3B is a layout diagram of through electrodes in a peripheral region 33 of a core chip 24a of the memory device 20, in accordance with an embodiment of the present disclosure. Description of components corresponding to components included in FIG. 3A will not be repeated.

The peripheral region 33 may include vias 25. In some embodiments, the vias 25 may be through electrodes. In some embodiments, the vias 25 may be TSVs. The vias 25 may be disposed on the chip 24a to form a square grid on a plane defined by the directions 100 and 110. Thus, the vias 25 may be arranged in rows in the direction 100 and columns in the direction 110. A portion of the vias 25 may provide power supply voltages and another portion of the vias 25 may provide signals, such as clock signals, data signals and control signals. A portion of the vias 25 may be disposed in proximity to power lines in the memory arrays 31 adjacent to the peripheral region 33.

Figure 4A:
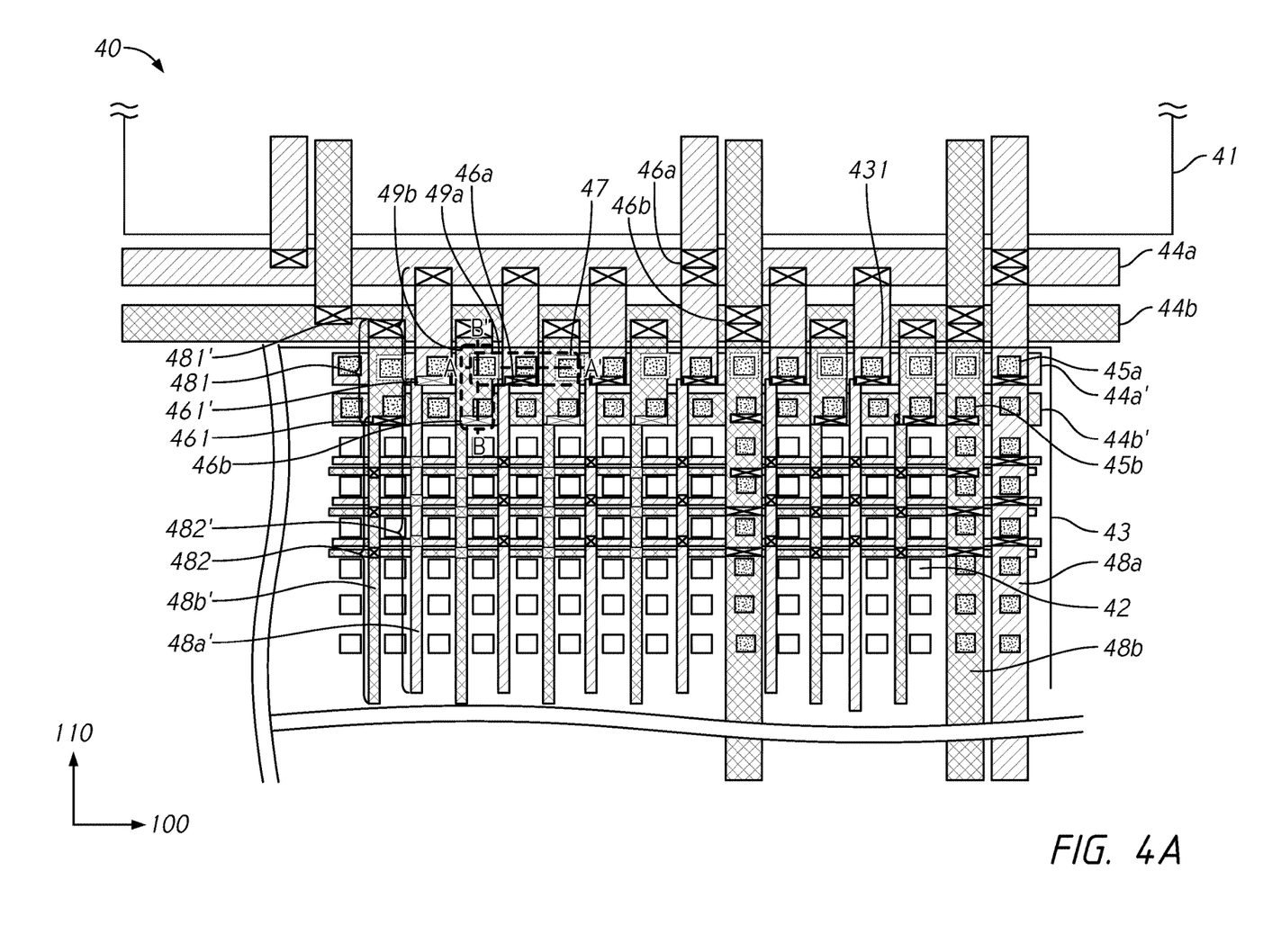
FIG. 4A is a simplified layout diagram of a portion of a core chip including through electrodes in a semiconductor device, in accordance with an embodiment of the present disclosure.

FIG. 4A is a simplified layout diagram of a portion 40 of a core chip including through electrodes in a semiconductor device, in accordance with an embodiment of the present disclosure. In some embodiments, the portion 40 may be a portion of any of core chips 24 in FIGS. 1-3B.

The portion 40 of the core chip may include a memory array region 41 and a peripheral region 43. In some embodiments, the memory array region 41 may include memory arrays 31 of FIG. 3A. In some embodiments, the peripheral region 43 may be the peripheral region 33 of FIGS. 3A and 3B. Description of components in FIG. 4A corresponding to components included in FIGS. 3A and 3B will not be repeated.

The portion 40 of the core chip may also include signal vias 42, power vias 45a and 45b. In some embodiments, the signal vias 42 and the power vias 45a and 45b may be through electrodes (TSVs). The power vias 45a may be coupled to any of wirings 48a extending in the direction 110. The power vias 45b may be coupled to any of wirings 48b extending in the direction 110. The power vias 45a may provide a power supply voltage (e.g., $V_{SS}$) from an I/F chip (e.g., the I/F chip 23) to the wirings 48a coupled to the power vias 45a. The power vias 45b may provide a power supply voltage (e.g., $V_{DD}$) from the I/F chip (e.g., the I/F chip 23) to the wiring 48b coupled to the power vias 45b. Some of the wirings 48a and 48b may extend to the memory array region 41 and provide the power supply voltages (e.g., $V_{SS}$ and $V_{DD}$) to the memory arrays 31 in the memory array region 41. In some embodiments, the wirings 48a and 48b may include material having low resistance. For example, the wirings 48a and 48b may include metal.

The portion 40 of the core chip may also include wirings 44a and 44b extending in the direction 100 along a border of the memory array region 41 and the peripheral region 43. In some embodiments, the portion 40 of the core chip may further include wirings 44a' and 44b' in the peripheral region 43. The wirings 44a' and 44b' may extend in the direction 100 along a side 431 of the peripheral region 43 adjacent to the memory array region 41. In some embodiments, the wirings 44a, 44b, 44a' and 44b' may include material having low resistance. For example, the wirings 44a, 44b, 44a' and 44b' may include metal. The wirings 44a and 44a' may be coupled to the wirings 48a that may provide the power supply voltage (e.g., $V_{SS}$) through vias 46a. The wirings 44b and 44b' may be coupled to the wirings 48b that may provide the power supply voltage (e.g., $V_{DD}$) through vias 46b. In some embodiments, the vias 46a and 46b may be electrodes that may couple two metal layers, such as a first metal layer and a second metal layer above the first metal layer. In some embodiments, the first metal layer may include either the wirings 44a and 44a' or the wirings 44b and 44b', and the second metal layer may include either the wirings 48a or the wirings 48b.

In some embodiments, a power supply voltage (e.g., $V_{SS}$) from the I/F chip may be provided to the portion 40 through power vias 45a arranged along the wiring 48a in the direction 110. The power vias 45a are disposed through the wiring 48a. The power vias 45a may provide the power supply voltage to the wirings 48a. The wirings 48a may provide the power supply voltage to the wiring 44a through the vias 46a. The wiring 44a may be coupled to power lines in the memory array region 41. Similarly, a power supply voltage (e.g., $V_{DD}$) from the I/F chip may be provided to the portion 40 through the power vias 45b arranged along the wiring 48a in the direction 110. The power vias 45b are disposed through the wiring 43b. The power vias 45b may provide the power supply voltage to the wirings 48b. The wirings 48b may provide the power supply voltage to the wiring 44b through the vias 46b. The wiring 44b may be coupled to other power lines in the memory array region 41. Thus, the power supply voltages (e.g., $V_{DD}$ and $V_{SS}$) from the I/F chip may be provided to the memory array region 41.

In some embodiments, the power supply voltages may be provided to circuits around each of the signal vias 42. For example, the circuits may include signal drivers. The power supply voltage (e.g., $V_{SS}$) from the I/F chip may be provided to the portion 40 through power vias 45a arranged along the wiring 44a' in the direction 100. The power vias 45a are disposed through the wiring 44a'. A portion of the power vias 45a along the wiring 44a' may provide the power supply voltage to the wirings 48a that are coupled to the power vias 45a. The wirings 48a may provide the power supply voltage to the circuits around each of the signal vias 42. Another portion of the power vias 45a may be disposed through wirings 48b. Each of the wirings 48b may have an opening 47 around each of the other portion of the power vias 45a that is through the opening 47. The opening 47 may provide a gap between each of the wirings 48b and each of the other portion of the power vias 45a. The opening 47 may isolate each of the wirings 48b from each of the other portion of the power vias 45a. Similarly, the power supply voltage (e.g., $V_{DD}$) from the I/F chip may be provided to the portion 40 through power vias 45b arranged along the wiring 44b' in the direction 100. The power vias 45b are disposed through and coupled to the wiring 44b'. The power vias 45b are also coupled to the wiring 48b. A portion of the power vias 45b along the wiring 44b' may provide the power supply voltage to the wirings 44b' and 48b that are coupled to the power vias 45b. The wirings 48b may provide the power supply voltage to the circuits around each of the signal vias 42. Another portion of the power vias 45b may be disposed through wirings 48a. Each of the wirings 48a may have an opening 47 around each of the other portion of the power vias 45b that is through the opening 47. The opening 47 may provide a gap between each of the wirings 48a and each of the other portion of the power vias 45b. The opening 47 may isolate each of the wirings 48a from each of the other portion of the power vias 45b.

In some embodiments, some of wirings 48a and 48b may include two layers. A wiring 48b' of the wirings 48b includes a first layer 481 that may extend from the wiring 44b' in the direction 110 to the memory array region 41 and a second layer 482 that may extend from above the wiring 44b' in a direction opposite to the direction 110. The first layer 481 and the second layer 482 may be coupled by a via 461. Each of the power vias 45b may be coupled to the first layer 481. In some embodiments, the second layer 482 may have a less width than a width of the first layer 481 to pass between adjacent signal vias 42. The second layer 482 of the wiring 48b may provide the power supply voltage (e.g., $V_{DD}$) from the via 461 to the circuits around each of the signal vias 42. A wiring 48a' of the wirings 48a includes a first layer 481' that may extend from the wiring 44a' in the direction 110 to the memory array region 41 and a second layer 482' that may extend from above the wiring 44a' in a direction opposite to the direction 110. The first layer 481' and the second layer 482' may be coupled by a via 461'. Each of the power vias 45a may be coupled to the first layer 481'. In some embodiments, the second layer 482' may have a less width than a width of the first layer 481' to pass between adjacent signal vias 42. The second layer 482' of the wiring 48b may provide the power supply voltage (e.g., $V_{SS}$) from the via 461' to the circuits around each of the signal vias 42.

The signal vias 42 that provides signals (e.g., data signals, clock signals, control signals, etc.) from the I/F chip (e.g., the I/F chip 23) may be separated from the memory array region 41 by the power vias 45a and 45b that provide the power supply voltages (e.g., $V_{DD}$ and $V_{SS}$) from the I/F chip (e.g., the I/F chip 23). Interference on the signal vias 42 due to power noises in the memory array region 41 and interference on signal lines in the memory array region 41 due to power noises around the signal vias 42 in the peripheral region 43 may be reduced by including the power vias 45a and 45b that provides the power supply voltages directly from the I/F chip between the memory array region 41 and the signal vias 42.

Figure 4B:
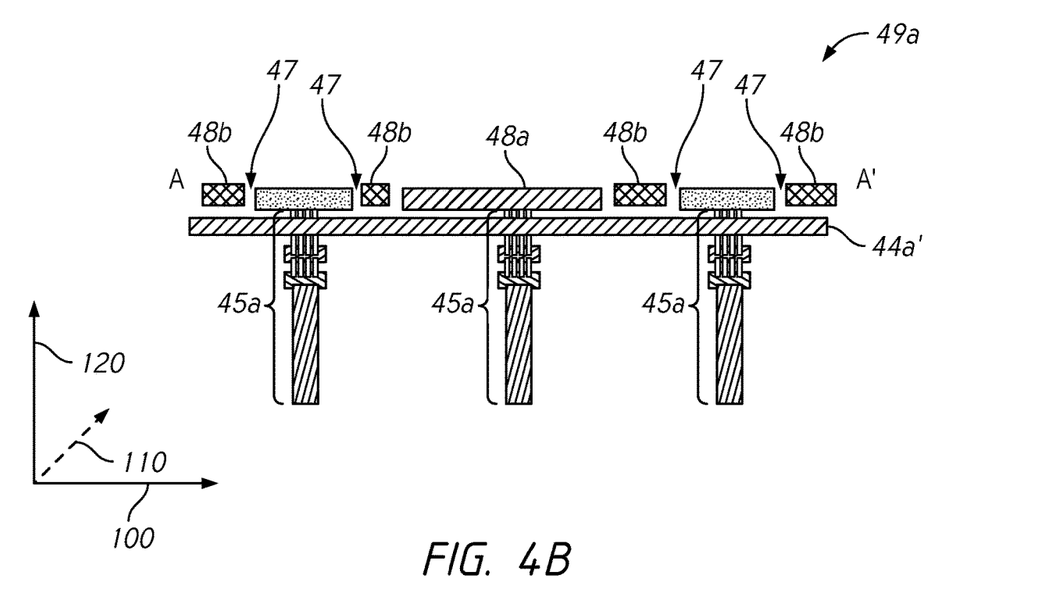
FIG. 4B is a schematic diagram of a portion of the core chip, in accordance with an embodiment of the present disclosure.

FIG. 4B is a schematic diagram of a portion 49a of the core chip, in accordance with an embodiment of the present disclosure. FIG. 4B is a cross-sectional view of the portion 49a along a line A-A' in FIG. 4A. The portion 49a may include power vias 45a aligned in the direction 100. The power vias 45a are disposed through the wiring 44a' in the direction 120. A middle power via 45a of the power vias 45a is coupled to a wiring 48a. Each of a left power via 45a and a right power via 45a of the power vias 45a may have a top surface. The top surface of each of the left and right power vias 45a may be disposed in a corresponding opening 47 in each corresponding wiring 48b of wirings 48b. The corresponding opening 47 provides a gap between the power via 45a and the corresponding wiring 48b. Thus, the wirings 48b may be isolated from the left and right power vias 45a, while the middle power via 45a may provide a power supply voltage (e.g., $V_{SS}$) from the I/F chip (e.g., the I/F chip 23) to the wirings 44a' and 48a.

Figure 4C:
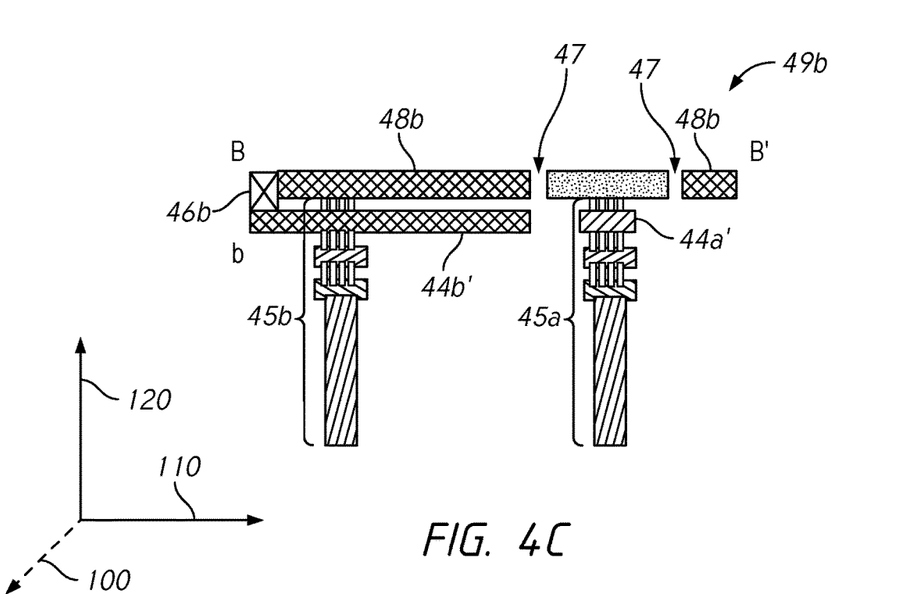
FIG. 4C is a schematic diagram of a portion of the core chip, in accordance with an embodiment of the present disclosure.

FIG. 4C is a schematic diagram of a portion 49b of the core chip, in accordance with an embodiment of the present disclosure. FIG. 4C is a cross-sectional view of the portion 49a along a line B-B' in FIG. 4A. The portion 49b may include power vias 45b and 45a aligned in the direction 110. The power via 45a is disposed through the wiring 44a'. The power via 45b is disposed through the wiring 44b' extending in the direction 100 and the wiring 48b extending in the direction 110. In some embodiments, a via 46b may be disposed between the wirings 48b and 44b' to couple the wiring 44b' to the wiring 48b.

The power via 45a is disposed through the wiring 44a'. In some embodiments, the power via 45a may be the left power via 45a of FIG. 4B. The power via 45a may have a top surface. The top surface of the power via 45a may be disposed in an opening 47 in the wiring 48b extending in the direction 110. The opening 47 provides a gap between the power via 45a and the wiring 48b. Thus, the power via 45a may provide a power supply voltage (e.g., $V_{SS}$) from the I/F chip (e.g., the I/F chip 23) to the wiring 44a', while the power via 45b may provide a power supply voltage (e.g., $V_{DD}$) from the I/F chip (e.g., the I/F chip 23) to the wiring 44b' and 48b.

Figure 5:
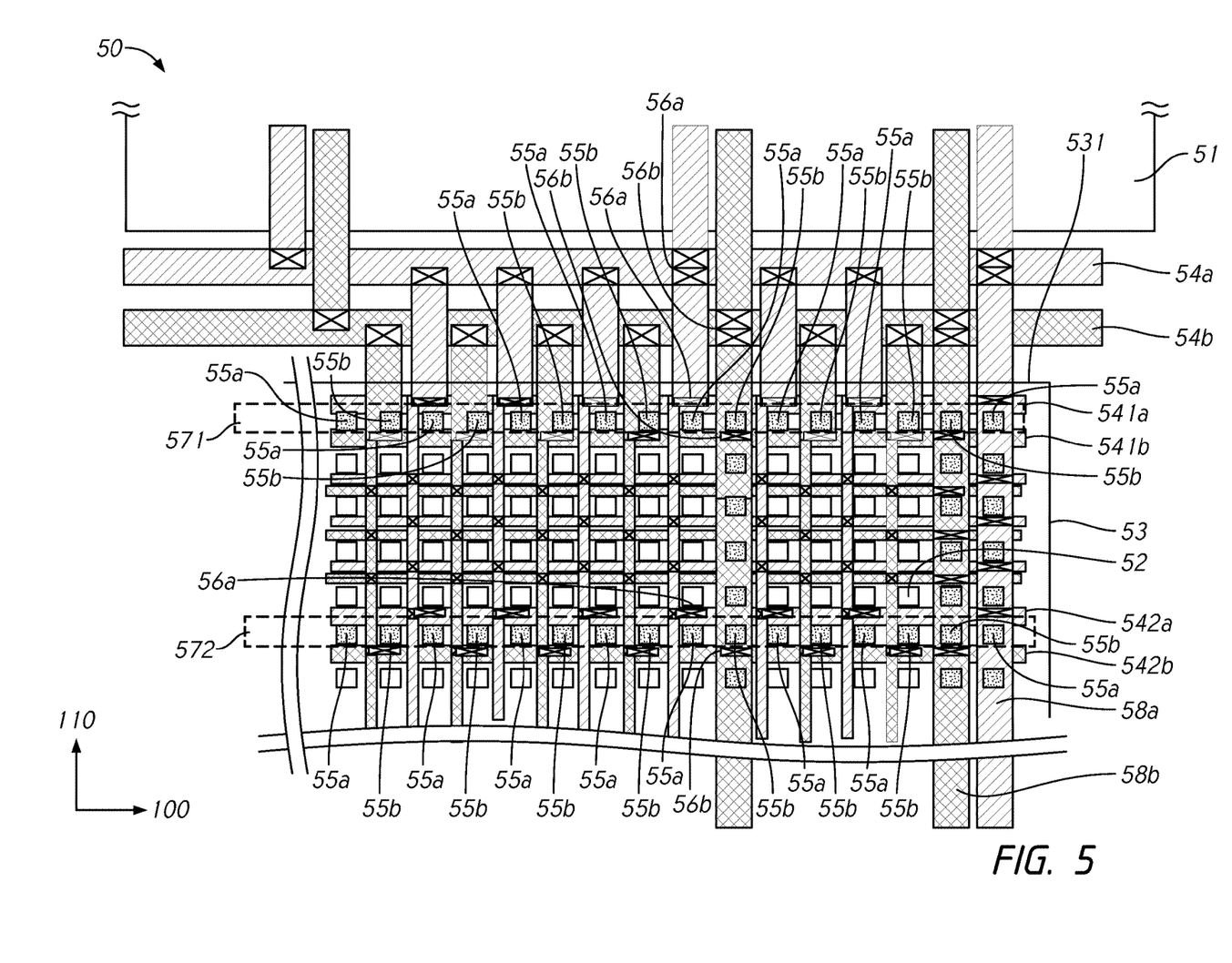
FIG. 5 is a simplified layout diagram of a core chip including through electrodes in a semiconductor device, in accordance with an embodiment of the present disclosure.

Wirings 44a' and 44b' providing power supply voltages from power vias are disposed along the side 431 of the peripheral region 43 adjacent to the memory array region 41. Power vias (e.g., power vias 45a and 45b) disposed through the wirings (e.g., the wirings 44a' and 44b') include power vias disposed through and coupled to the wirings and also includes power vias disposed through and isolated from the wirings (e.g., in some embodiments, the power via is isolated from the wirings by an opening in the wiring that is around the power via). FIG. 5 is a simplified layout diagram of a portion 50 of a core chip including through electrodes in a semiconductor device, in accordance with an embodiment of the present disclosure. In some embodiments, the portion 50 may be a portion of any of core chips 24 in FIGS. 1-3B.

The portion 50 of the core chip may include a memory array region 51 and a peripheral region 53. In some embodiments, the memory array region 51 may include memory arrays 31 of FIG. 3A. In some embodiments, the peripheral region 53 may be the peripheral region 33 of FIGS. 3A and 3B. Description of components in FIG. 5 corresponding to components included in FIGS. 3A and 3B will not be repeated.

The portion 50 of the core chip may also include signal vias 52, power vias 55a and 55b. The signal vias 52 and the power vias 55a and 55b may be through electrodes. In some embodiments, the signal vias 52 and the power vias 55a and 55b may be TSVs. The power vias 55a may be coupled to any of wirings 58a extending in the direction 110. The power vias 55b may be coupled to any of wirings 58b extending in the direction 110. The power vias 55a may provide a power supply voltage (e.g., $V_{SS}$) from an I/F chip (e.g., the I/F chip 23) to the wirings 58a coupled to the power vias 55a. The power vias 55b may provide a power supply voltage (e.g., $V_{DD}$) from the I/F chip (e.g., the I/F chip 23) to the wiring 58b coupled to the power vias 55b. Some of the wirings 58a and 58b may extend to the memory array region 51 and provide the power supply voltages (e.g., $V_{DD}$ and $V_{SS}$) to the memory arrays 31 in the memory array region 51. In some embodiments, the wirings 58a and 58b may include material having low resistance. For example, the wirings 58a and 58b may include metal. In some embodiments, some of wirings 58a and 58b may include two layers coupled by a via. Configuration of two layers of some of wirings 58a and 58b is similar to configuration of first and second layers of the wirings 48a' and 48b', thus the description of the two layers of some of wirings 58a and 58b will not be repeated.

The portion 50 of the core chip may also include wirings 54a and 54b extending in the direction 100 along a border of the memory array region 51 and the peripheral region 53. In some embodiments, the portion 50 of the core chip may further include a pair of wirings 541a and 541b in the peripheral region 53. The pair of wirings 541a and 541b may extend in the direction 100 along a side 531 of the peripheral region 53 adjacent to the memory array region 51. In some embodiments, the portion 50 of the core chip may further include a pair of wirings 542a and 542b in the peripheral region 53. The wirings 542a and 542b may extend in the direction 100, away from the memory array region 51. In some embodiments, the portion 50 may include one or more rows of signal vias 52 between the pair of the wirings 541a and 541b and the pair of wirings 542a and 542b. The portion 50 may also include another one or more rows of signal vias 52 disposed in a direction opposite to the direction 110 with respect to the pair of wirings 542a and 542b. The pair of wirings 542a and 542b may be disposed between the one or more rows of the signal vias 52 and the other one or more rows of the signal vias 52. In some embodiments, the wirings 54a, 54b, 541a and 541b may include material having low resistance. For example, the wirings 54a, 54b, 541a and 541b may include metal.

The wirings 54a, 541a and 542a may be coupled to the wirings 58a that may provide the power supply voltage (e.g., $V_{DD}$) through vias 56a. The wirings 54b, 541b and 542b may be coupled to the wirings 58b that may provide the power supply voltage (e.g., $V_{SS}$) through vias 56b. In some embodiments, the vias 56a and 56b may be electrodes that may couple two metal layers, such as a first metal layer and a second metal layer above the first metal layer. In some embodiments, the first metal layer may include either the wirings 54a, 541a and 542a or the wirings 54b, 541b and 542b, and the second metal layer may include either the wirings 58a or the wirings 58b.

In some embodiments, a power supply voltage (e.g., $V_{SS}$) from the I/F chip may be provided to the portion 50 through power vias 55a arranged along the wirings 58a in the direction 110. The power vias 55a are disposed through and coupled to the wirings 58a. The power vias 55a may provide the power supply voltage to the wirings 58a. For example, some of the power vias 55a may be arranged along the wiring 58a at the right end of FIG. 5. The wirings 58a may provide the power supply voltage to the wirings 54a through the vias 56a. The wirings 54a may be coupled to power lines in the memory array region 51. Similarly, a power supply voltage (e.g., $V_{DD}$) from the I/F chip may be provided to the portion 50 through the power vias 55b arranged along the wirings 58b in the direction 110. The power vias 55b are disposed through and coupled to the wirings 58b. For example, some of the power vias 55b may be arranged along the wiring 58b next to the wiring 58a at the right end of FIG. 5. The power vias 55b may provide the power supply voltage to the wirings 58b. The wirings 58b may provide the power supply voltage to the wiring 54b through the vias 56b. The wiring 54b may be coupled to other power lines in the memory array region 51. Thus, the power supply voltages (e.g., $V_{DD}$ and $V_{SS}$) from the I/F chip may be provided to the memory array region 51.

In some embodiments, the power supply voltages may be provided to circuits around each of the signal vias 52. For example, the circuits may include signal drivers. The portion 50 includes a group 571 of power vias and a group 572 of power vias. In some embodiments, the group 571 of power vias may be disposed along the direction 100 between the wirings 541a and 541b. In some embodiments, the group 572 of power vias may be disposed along the direction 100 between the wirings 542a and 542b. Each of the group 571 and the group 572 may include power vias 55a and 55b. Some of the power vias 55a and 55b in each of the group 571 and the group 572 may alternate in a row. The power vias 55a in the groups 571 and 572 of power vias may be coupled to the wirings 58a. A portion of each of the wirings 58a may extend in the direction 110 between adjacent signal vias 52 of the signal vias 52. The power vias 55a in the groups 571 and 572 and the wirings 58a may provide the power supply voltage (e.g., $V_{SS}$) from the I/F chip to the circuits. The power vias 55b in the groups 571 and 572 of power vias may be coupled to the wirings 58b. A portion of each of the wirings 58b may extend in the direction 110 between adjacent signal vias 52 of the signal vias 52. The power vias 55b in the groups 571 and 572 and the wirings 58b may provide the power supply voltage (e.g., $V_{DD}$) from the I/F chip to the circuits. The group 571 of power vias 55a and 55b may provide relatively stable power supply voltages through the wirings 58a, 58b, and the wirings 54a and 54b. The groups 571 and 572 of power vias 55a and 55b may provide relatively stable power supply voltages through wirings 58a and 58b between the signal vias 52. The group 572 of power vias may be less affected by noises in and around the memory array region 51. Due to closeness of the group 572 of power vias to the circuits disposed remotely from the group 571 of power vias, and less noises from the memory array region 51, the group 572 of power vias may provide relatively stable power supply voltages to the circuits regardless of a distance from the circuits to the group 571 of power vias.

Figure 6:
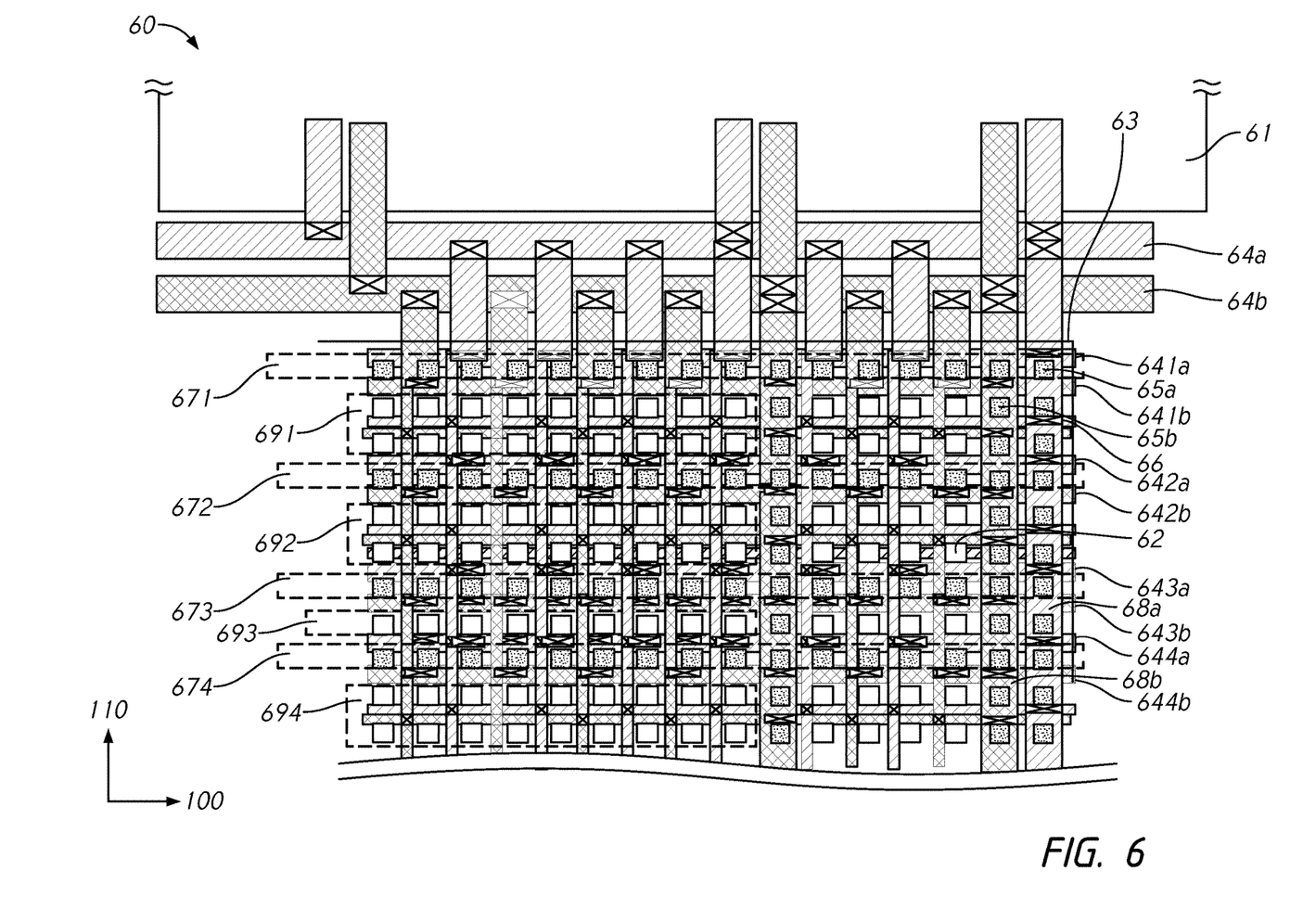
FIG. 6 is a simplified layout diagram of a core chip including through electrodes in a semiconductor device, in accordance with an embodiment of the present disclosure.

FIG. 6 is a simplified layout diagram of a portion 60 of a core chip including through electrodes in a semiconductor device, in accordance with an embodiment of the present disclosure. In some embodiments, the portion 60 may be a portion of any of core chips 24 in FIGS. 1-3B.

The portion 60 of the core chip may include a memory array region 61 and a peripheral region 63. In some embodiments, the memory array region 61 may include memory arrays 31 of FIG. 3A. In some embodiments, the peripheral region 63 may be the peripheral region 33 of FIGS. 3A and 3B. Description of components in FIG. 6 corresponding to components included in FIGS. 3A and 3B will not be repeated.

The portion 60 of the core chip may also include signal vias 62, power vias 65a and 65b. The power vias 65a may be coupled to any of wirings 68a extending in the direction 110 and further coupled to the wiring 64a extending in the direction 100. The power vias 65b may be coupled to any of wirings 68b extending in the direction 110 and further coupled to the wiring 64b extending in the direction 100. Operations of the power vias 65a and 65b with regards to the wirings 68a and 68b and the wirings 64a and 64b are similar to the operations of the power vias 55a and 55b with regards to the wirings 58a and 58b and the wirings 54a and 54b in FIG. 5, thus the description of the operations of the power vias 65a and 65b with regards to the wirings 68a and 68b and the wirings 64a and 64b will not be repeated.

In some embodiments, the portion 60 of the core chip may further include a pair of wirings 641a and 641b in the peripheral region 63. The pair of wirings 641a and 641b may extend in the direction 100 along a side 631 of the peripheral region 63 adjacent to the memory array region 61. The portion 60 includes a group 671 of power vias disposed along the direction 100. In some embodiments, the group 671 of power vias may be disposed between the wirings 641a and 641b.

In some embodiments, the portion 60 of the core chip may include pairs of wirings in the peripheral region 63. For example, the pairs of wirings may include a pair of wirings 642a and 642b, a pair of wirings 643a and 643b and a pair of wirings 644a and 644b as shown in FIG. 6. The portion 60 includes a group 672 of power vias disposed along the direction 100. The group 672 of power vias may be disposed in the direction opposite to the direction 110 with respect to the group 671 of power vias. The wirings 642a and 642b may extend in the direction 100. The wirings 642a and 642b may be disposed in the direction opposite to the direction 110 with respect to the wirings 641a and 641b. In some embodiments, the group 672 of power vias may be disposed between the wirings 642a and 642b. In some embodiments, the portion 60 may include a group 691 of one or more rows of signal vias 62 between the groups 671 and 672 of the power vias. For example, the group 691 may include two rows of signal vias 62 in FIG. 6.

The portion 60 includes a group 673 of power vias disposed along the direction 100. The group 673 of power vias may be disposed in the direction opposite to the direction 110 with respect to the group 672 of power vias. The wirings 643a and 643b may extend in the direction 100. The wirings 643a and 643b may be disposed in the direction opposite to the direction 110 with respect to the wirings 642a and 642b. In some embodiments, the group 673 of power vias may be disposed between the wirings 643a and 643b. In some embodiments, the portion 60 may include a group 692 of one or more rows of signal vias 62 between the groups 672 and 673 of the power vias. For example, the group 692 may include two rows of signal vias 62 in FIG. 6.

The portion 60 includes a group 674 of power vias disposed along the direction 100. The group 674 of power vias may be disposed in the direction opposite to the direction 110 with respect to the group 673 of power vias.

The wirings 644a and 644b may extend in the direction 100. The wirings 644a and 644b may be disposed in the direction opposite to the direction 110 with respect to the wirings 644a and 644b. In some embodiments, the group 674 of power vias may be disposed between the wirings 644a and 644b. In some embodiments, the portion 60 may include a group 693 of one or more rows of signal vias 62 between the groups 673 and 674 of the power vias. For example, the group 693 may include one row of signal vias 62 in FIG. 6. In some embodiments, the portion 60 may include a group 694 of one or more rows of signal vias 62 in the direction opposite to the direction 110 with respect to the group 674 of power vias. For example, the group 693 may include one row of signal vias 62 in FIG. 6.

In some embodiments, each of the groups 671, 672, 673 and 674 may include power vias 65a and 65b alternating in each row. The power vias 65a in the groups 671 and 672 may provide the power supply voltage (e.g., $V_{SS}$) to the circuits around the signal vias 62 of the group 691, and the power vias 65b in the groups 671 and 672 may provide the power supply voltage (e.g., $V_{DD}$) to the circuits around the signal vias 62 of the group 691. The power vias 65a in the groups 672 and 673 may provide the power supply voltage (e.g., $V_{SS}$) to the circuits around the signal vias 62 of the group 692, and the power vias 65b in the groups 672 and 673 may provide the power supply voltage (e.g., $V_{DD}$) to the circuits around the signal vias 62 of the group 692. The power vias 65a in the groups 673 and 674 may provide the power supply voltage (e.g., $V_{SS}$) to the circuits around the signal vias 62 of the group 693, and the power vias 65b in the groups 673 and 674 may provide the power supply voltage (e.g., $V_{DD}$) to the circuits around the signal vias 62 of the group 693. The power vias 65a and 65b in the group 674 may also provide the power supply voltages (e.g., $V_{SS}$ and $V_{DD}$) to the circuits around the signal vias 62 of the group 694, respectively.

In some embodiments, the groups 691, 692 and 694 of the signal vias may transmit data signals from/to an I/F chip (e.g., the I/F chip 23). The portion 60 may further include circuits related to the data transmission by the groups 691, 692 and 694 of the signal vias. The data transmission at the groups 691, 692 and 694 of the signal vias may cause noises on power supply lines. Regardless of the noise, the groups 671, 672, 673 and 674 of power vias 65a and 65b may provide relatively stable power supply voltages through wirings to adjacent groups 691, 692 and 694 of the signal vias. Thus, the circuits around the groups 691, 692 and 694 of the signal vias may be less affected by the noises from the other circuits related to the data transmission.

Furthermore, the groups 671, 672, 673 and 674 of power vias 65a and 65b may operate without driver circuits and areas around the power vias 65a and 65b may be available. Some of the circuits related to the data transmission by the groups 691, 692 and 694 may be disposed around the power vias 65a and 65b in the groups 671, 672, 673 and 674.

In some embodiments, the group 693 of one or more rows of signal vias 62 may transmit a clock signal from an I/F chip (e.g., the I/F chip 23). The portion 60 may further include one or more clock generators (not shown) disposed between the groups 673 and 674 of power vias 65a and 65b. The one or more clock generators may receive the clock signal received from the group 693 of one or more rows of signal vias 62 and may further provide a local clock signal responsive to the received clock signal. While data transmission at the groups 691, 692 and 694 of the signal vias may cause noises on power supply lines, the groups 673 and 674 of power vias 65a and 65b may provide relatively stable power supply voltages through wirings to the groups 693 of the signal vias and reduce the noises from the adjacent groups 692 and 694 of the signal vias and the circuits related to data transmission. Thus, the group 693 of one or more rows of signal vias 62 and the one or more clock generators may provide a clock signal in a relatively stable manner.

Figure 7:
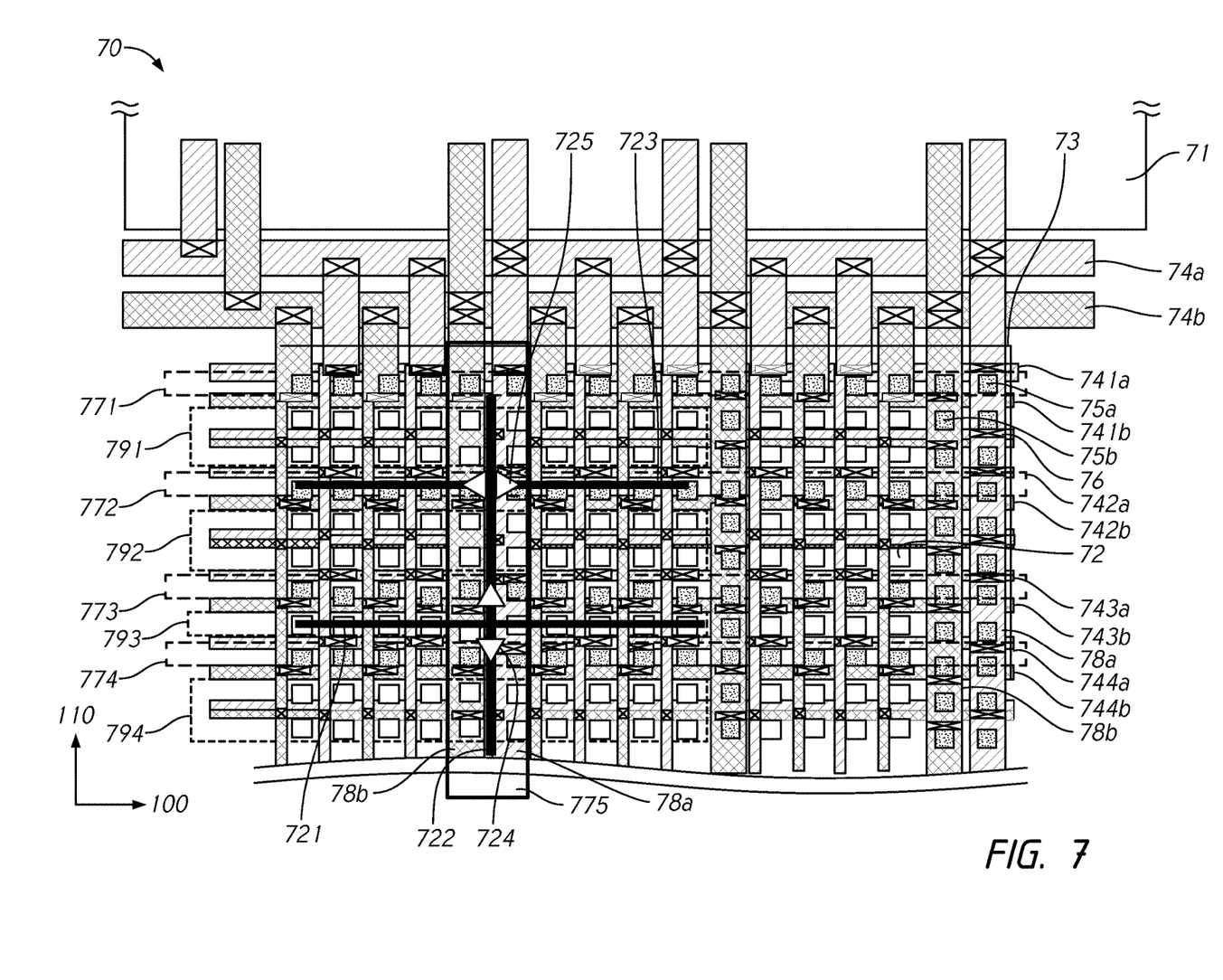
FIG. 7 is a simplified layout diagram of a core chip including through electrodes in a semiconductor device, in accordance with an embodiment of the present disclosure.

FIG. 7 is a simplified layout diagram of a portion 70 of a core chip including through electrodes in a semiconductor device, in accordance with an embodiment of the present disclosure. In some embodiments, the portion 70 may be a portion of any of core chips 24 in FIGS. 1-3B.

The portion 70 of the core chip may include a memory array region 71 and a peripheral region 73. In some embodiments, the memory array region 71 may include memory arrays 31 of FIG. 3A. In some embodiments, the peripheral region 73 may be the peripheral region 33 of FIGS. 3A and 3B. Description of components in FIG. 7 corresponding to components included in FIGS. 3A and 3B will not be repeated.

The portions 70 of the core chips includes pairs of wirings 741a and 741b, 742a and 742b, 743a and 743b and 744a and 744b, groups 771, 772, 773, 774 of power vias 75a and 75b and groups of 791, 792, 793 and 794 of signal vias 72. Configuration of the groups 771, 772, 773, 774 of power vias 75a and 75b, the groups of 791, 792, 793, and 794 of signal vias 72, and the pairs of wirings 741a and 741b, 742a and 742b, 743a and 743b and 744a and 744b is similar to configuration of groups 671, 672, 673, 674 of power vias 65a and 65b, groups of 691, 692, 693 and 694 of signal vias 62, and pairs of wirings 641a and 641b, 642a and 642b, 643a and 643b and 644a and 644b, respectively, thus the description of the groups 771, 772, 773, 774 of power vias 75a and 75b, the groups of 791, 792, 793, and 794 of signal vias 72, and the pairs of wirings 741a and 741b, 742a and 742b, 743a and 743b and 744a and 744b will not be repeated.

In some embodiments, the portion 70 of the core chip may further include a group 775 of power vias 75a and 75b extending in the direction 110 in the peripheral region 73. The portion 70 may also include pairs of wirings 78a and 78b extending in the direction 110. The group 775 of power vias 75a and 75b may be disposed along one pair of wirings 78a and 78b, among the pairs of wirings 78a and 78b, respectively. The power vias 75a and 75b in the group 775 may be disposed through and coupled to the wiring 78a and 78b, respectively. Operations of the power vias 75a and 75b with regards to the wirings 78a and 78b are similar to the operations of the power vias 65a and 65b with regards to the wirings 68a and 68b in FIG. 6, thus the description of the operations of the power vias 75a and 75b with regards to the wirings 78a and 78b will not be repeated. The groups 775 of power vias 75a and 75b may intersect the groups 771, 772, 773, 774 of power vias 75a and 75b, the groups of 791, 792, 793 and 794 of signal vias 72.

In some embodiments, the group 793 of one or more rows of signal vias 72 may transmit a clock signal from an I/F chip (e.g., the I/F chip 23). The portion 70 may further include one or more clock generators (not shown) disposed between the groups 773 and 774 of power vias 75a and 75b. The one or more clock generators may receive the clock signal received from the group 793 of one or more rows of signal vias 72 and may further provide a local clock signal responsive to the received clock signal. The portion 70 may include a clock wiring 721 extending in the direction 100 along the group 793 of one or more rows of signal vias 72. The clock wiring 721 may provide the local clock signal from the one or more clock generators.

The group 775 of power vias 75a and 75b may operate without driver circuits and areas around the power vias 75a and 75b may be available. The portion 70 may include another clock wiring 722 that may extend in the direction 110 between the power vias 75a and 75b of the group 775. The clock wiring 722 may be coupled to the clock wiring 721. The clock wiring 722 may include clock drivers 724 near a node where the clock wirings 721 and 722 are coupled.

The group 772 of power vias 75a and 75b may operate without driver circuits and areas around the power vias 75a and 75b may be available. The portion 70 may include another clock wiring 723 that may extend in the direction 100 around the power vias 75a and 75b of the group 772. The clock wiring 723 may be coupled to the clock wiring 722. The clock wiring 723 may include clock drivers 725 near a node where the clock wirings 722 and 723 are coupled.

As shown, clock wirings and clock drivers may be disposed around power vias. By providing a clock tree including clock wirings extending around the power vias, noises from adjacent groups of signal vias and circuits related to data transmission may be reduced.

Layouts of power vias in areas providing different noises will reduce propagation of noises from one of the areas to another area. A plurality of power vias adjacent to a memory array region may be disposed in a peripheral region. The plurality of power vias may reduce noise propagation between the memory array region and the peripheral region. In some embodiments, groups of signal vias in one or more rows may be disposed between adjacent groups of power vias in a row. The adjacent groups of power vias may provide stable power supply voltage to circuits around signal vias while preventing noise propagation.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or subcombination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:

1. An apparatus comprising:
   a memory array region;
   a peripheral region adjacent to the memory array region;
   a plurality of power vias in the peripheral region configured to provide one or more power supply voltages from an interface chip; and
   one or more wirings in the peripheral region, a first wiring of the one or more wirings adjacent to the memory array extending in a first direction,
   wherein one or more power vias of the plurality of power vias are disposed through a respective wiring of the one or more wirings, and wherein the one or more power vias are along a second wiring of the one or more wirings, the second wiring extending from the peripheral region to the memory array region in a second direction perpendicular to the first direction.

2. The apparatus of claim 1, wherein the plurality of power vias comprises:
   a first power via configured to provide a first supply voltage from the interface chip; and
   a second power via configured to provide a second supply voltage from the interface chip.

3. The apparatus of claim 1, further comprising: a third wiring extending in the first direction along a border of the memory array region and the peripheral region, wherein the third wiring is coupled to the second wiring.

4. An apparatus comprising:
   a memory array region;
   a peripheral region adjacent to the memory array region;
   a plurality of power vias in the peripheral region configured to provide one or more power supply voltages; and
   one or more wirings in the peripheral region, the one or more wirings adjacent to the memory array region,
   wherein one or more power vias of the plurality of power vias are disposed through a respective wiring of the one or more wirings, wherein the plurality of power vias comprises:
   a first power via configured to provide a first supply voltage from an interface chip; and
   a second power via configured to provide a second supply voltage from the interface chip, wherein the one or more wirings comprises a wiring,
   wherein the first power via and the second power via are disposed through the wiring,
   wherein the first power via is coupled to the wiring, and
   wherein the wiring comprises an opening around the second power via, configured to isolate the wiring from the second power via.

5. An apparatus comprising:
   a memory region:
   a peripheral region adjacent to the memory array region;
   a plurality of power vias in the peripheral region configured to provide one or more power supply voltages; and
   one or more wirings in the peripheral region, the one or more wirings adjacent to the memory array region,
   wherein one or more power vias of the plurality of power vias are disposed through a wiring of the one or more wirings, wherein the plurality of power vias comprises:
   a first power via configured to provide a first supply voltage from an interface chip; and
   a second power via configured to provide a second supply voltage from the interface chip, wherein the one or more wirings comprises a first wiring and a second wiring;
   wherein the first power via is disposed through the first wiring and is coupled to the first wiring, and
   wherein the second power via is disposed through the second wiring and is coupled to the second wiring.

6. The apparatus of claim 5, further comprising:
   a third wiring coupled to the first wiring; and,
   a fourth wiring coupled to the second wiring,
   wherein the first and second wirings extend along a side of the peripheral region adjacent to the memory array region, and
   wherein the third and fourth wirings extend in a direction perpendicular to the side of the peripheral region.

7. The apparatus of claim 6, further comprising a fifth wiring and a sixth wiring in the memory array region,
   wherein the third wiring in the peripheral region extends to the memory array region and is coupled to the fifth wiring, and wherein the fourth wiring in the peripheral region extends to the memory array region and is coupled to sixth wiring.

8. The apparatus of claim 7, wherein the fifth and sixth wirings in the memory array region extend along the side of the peripheral region.

9. The apparatus of claim 6, further comprising signal vias in the peripheral region,
wherein the first and second wirings are between the memory array region and the signal vias, and
wherein the third and fourth wirings extend between adjacent signal vias of the signal vias.

10. The apparatus of claim 9, wherein the third wiring comprises:
a first layer coupled to the first power vi, the first layer extending to the memory array region;
a second layer extending from the first wiring and between the cent signal vias; and
a via coupling the first and second layers.

11. The apparatus of claim 10, wherein a width of the second layer is less than a width of the first layer.

12. An apparatus comprising:
a core chip comprising a memory array region and a peripheral region adjacent to the memory array region, wherein the core chip comprising the memory array region and the peripheral region is stacked on an interface chip;
one or more wirings in the peripheral region, a first wiring of the one or more wirings adjacent to the memory array region and extending in a first direction; and
a group of power vias in the peripheral region, disposed adjacent to the memory array region, and further configured to provide one or more power supply voltages,
wherein the group of power vias are coupled to a second wiring of the one or more wirings, wherein the second wiring extends from the peripheral region to the memory array region in a second direction perpendicular to the first direction.

13. The apparatus of claim 12, wherein the group of power vias are a first group of power vias, and
wherein the apparatus further comprising a second group of power vias in the peripheral region, disposed away from the memory array region, and further configured to provide the one or more power supply voltages.

14. The apparatus of claim 13, wherein each group of the first and second groups of power vias comprises:
first power vias configured to provide a first supply voltage from the interface chip; and
second power vias configured to provide a supply voltage from the interface chip, and
wherein the first power vias and the second power vias in each group of the first and second groups of power vias alternate in a row.

15. The apparatus of claim 13, further comprising a plurality of signal vias in the peripheral region,
wherein the first group of power vias are between the memory array region and the plurality of signal vias, and
wherein the plurality of signal vias comprise a group of the signal vias between the first group of power vias and the second group or power vias.

16. An apparatus comprising:
a memory array region:
a peripheral region adjacent to the memory array region;
one or more wirings in the peripheral region, the one or more wirings adjacent to the memory array region; and a group of power vias in the peripheral region, disposed adjacent to the memory array region, and further configured to provide one or more power supply voltages,
wherein the group of power vias are coupled to a wiring of the one or more wirings,
wherein the group of power vias are a first group of power vias,
wherein the apparatus further comprises a second group of power vias in the peripheral region, disposed away from the memory array region, and further configured to provide the one or more power supply voltages,
wherein the apparatus further comprises a plurality of signal vias in the peripheral region,
wherein the first group of power vias are between the memory array region and the plurality of signal vias, and
wherein the plurality of signal vias comprise a group of the signal vias between the first group of power vias and the second group of power vias,
wherein the group of the signal vias is a first group of signal vias,
wherein the plurality of signal vias further comprise a second group of signal vias, and
wherein the second group of power vias are between the first group of signal vias and the second group of signal vias.

17. The apparatus of claim 16, wherein first group of signal vias and the second group of signal vias are configured to provide data signals from and to an interface chip.

18. An apparatus comprising:
an interface chip; and
plurality of core chips stacked each other on the interface chip, each of the plurality of core chips including:
a memory array region;
a peripheral region adjacent to the memory array region;
one or more power wirings in the peripheral region, the one or more wirings adjacent to the memory region; and
a plurality of groups of through-substrate vias (TSVs) including:
a first group of power TSVs in the peripheral region, disposed adjacent to the memory array region, and further configured to provide one or more power supply voltages;
second and third groups of one or more rows of poower TSVs in the peripheral region, disposed away from the memory array region, and further configured to provide the one or more power supply voltages; and
a group of one or more rows of signal TSVs between the second and third groups of one or more rows of power vias, and further configured to provide a clock signal from the interface chip,
wherein the first group of power TSVs are coupled to a wiring of the one or more wirings.

19. The apparatus of claim 18, further comprising:
a clock generator between the second and third groups of one or more rows of power TSVs, configured to receive the clock signal from the group of one or more rows of signal vias and further configured to provide a local clock signal.

20. The apparatus of claim 19, further comprising:
a clock wiring extending along the group of one or more rows of signal TSVs, configured to provide the local clock signal from the clock generator.

21. The apparatus of claim 20, wherein the clock wiring is a first clock wiring,
wherein the apparatus further comprises:

a fourth group of one or more rows of power TSVs in the peripheral region, the fourth group of one or more rows of power TSVs intersecting the first, second and third groups of the one or more rows of power TSVs; and a second clock wiring between the fourth group one or more rows of power TSVs, coupled to the first clock wiring at a node and configured to provide the local clock signal.

22. The apparatus of claim 21, wherein the second clock wiring comprises a driver near the node.

23. The apparatus of claim 21, wherein the apparatus further comprises:

a fifth group of one or more rows of power TSVs in the peripheral region between the first group of power TSVs and the second group of one or more rows of power TSVs; and a third clock wiring along the fifth group one or more rows of power TSVs, coupled to the second clock wiring at another node and configured to provide the local clock signal.

24. The apparatus of claim 23, wherein the third clock wiring comprise a driver near the other node.

* * * * *